United States Patent
Maccarrone et al.

[11] Patent Number: 5,929,674
[45] Date of Patent: Jul. 27, 1999

[54] POWER ON RESET CIRCUIT WITH AUTO TURN OFF

[75] Inventors: Marco Maccarrone, Palestro; Stefano Ghezzi, Treviolo; Maurizio Branchetti, San Polo D'enza, all of Italy

[73] Assignee: SGS-Thomson Microelectronics S.r.l., Agrate Brianza, Italy

[21] Appl. No.: 08/846,757

[22] Filed: Apr. 30, 1997

[30] Foreign Application Priority Data

Apr. 30, 1996 [EP] European Pat. Off. ............ 9630247

[51] Int. Cl.$^6$ ............................................... H03L 7/00
[52] U.S. Cl. .......................... 327/143; 327/142; 327/198
[58] Field of Search .................................. 327/143, 198, 327/142

[56] References Cited

U.S. PATENT DOCUMENTS

| | | | |
|---|---|---|---|
| 4,697,097 | 9/1987 | Rusznyak | 327/546 |
| 5,144,159 | 9/1992 | Frisch et al. | 307/272.3 |

FOREIGN PATENT DOCUMENTS

0296930 A1  6/1988  European Pat. Off. .

OTHER PUBLICATIONS

IBM Technical Disclosure Bulletin, "CMOS Circuit to Sense the Value of the Input Power Supply to a Chip", vol. 31, No. 11, Apr. 1989, pp. 413–416.

*Primary Examiner*—Kenneth B. Wells
*Assistant Examiner*—Minh Nguyen
*Attorney, Agent, or Firm*—Allen, Dyer, Doppelt, Milbrath & Gilchrist, P.A.

[57] ABSTRACT

The present invention relates to an electronic power on reset circuit of the type including a comparator having at least two inputs and one output for receiving a first reference signal from a generator block and a second signal proportional to a supply voltage from a divider block and for producing an output initialization signal. Advantageously the output is connected to a third turn off enablement input of the comparator through the series of an inverter pair. The generator block and the divider block also include respective turn off enablement inputs connected downstream of the inverter pair.

24 Claims, 4 Drawing Sheets

POWER ON RESET CIRCUIT WITH AUTO TURN OFF

FIELD OF THE INVENTION

The present invention relates to an electronic power on reset circuit with an automatic turn-off device.

BACKGROUND OF THE INVENTION

Specifically, but not exclusively, the present invention concerns a circuit of the above mentioned type and comprises a comparator having at least two inputs and an output. The comparator receives a first reference signal from a generator block and a second signal proportional to a supply voltage from a divider block to produce an initialization signal as an output. As known, a common problem with nearly all digital electronic devices is the correct initialization of the device upon starting.

Specifically, digital electronic devices are normally associated with a so-called power on circuit which controls turning on of electric power and performs a reinitialization, or reset, of the digital device. In technical jargon the practice of denominating starting circuits assigned to the above mentioned reinitialization 'power on reset' is established.

The main function of the power on reset circuit is to generate a POR signal for a digital device. This signal is generated downstream of a comparison between the rising slope of a supply voltage of the digital device and a reference potential which is generally taken from a node inside the power on reset circuit. It is very important for correct operation of the circuit that the voltage value of this internal node reach the operating value in advance of the supply voltage. The comparison between the two voltage values is performed by a comparator which produces at output an INTPOR signal on which the POR signal depends directly.

Figure 1:
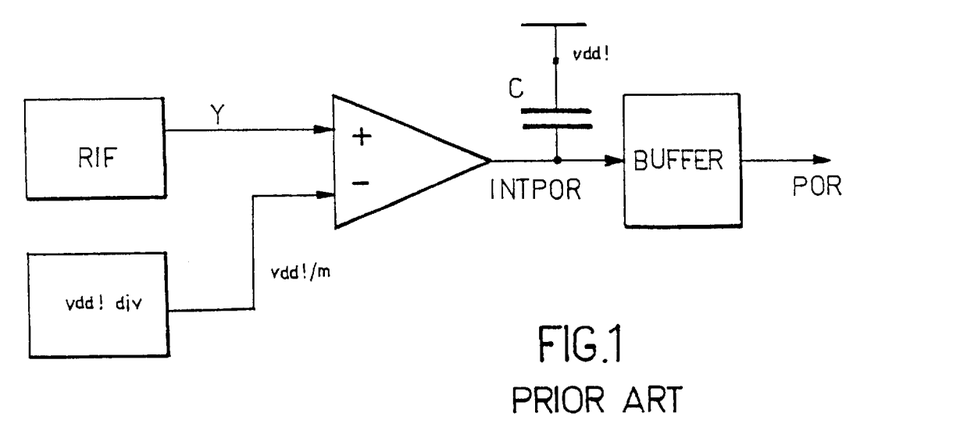
FIG. 1 shows a diagrammatic block view of a power on reset circuit provided in accordance with the prior art.

In FIG. 1 is shown an example of a power on reset circuit provided in accordance with the prior art. The internal reference node is indicated by the block RIF which is directly connected to an input of the comparator, while the block Vdd!div indicates a division of the supply voltage supplied to a second input of the comparator. The output of the comparator is coupled to the supply voltage Vdd through a capacitor C and is also connected to an output buffer which produces the POR signal.

The Vdd!div block produces an output voltage having the same linear behavior as the supply voltage Vdd, but with a slope reduced by a factor m. The factor m is for all purposes a division ratio which must be ensured with accuracy and stability. The capacitor C has the function of favoring the coupling of the INTPOR signal with the supply voltage Vdd during the rising transient thereof. In rated operation the value of INTPOR remains fixed from the comparator output.

The output buffer has the purpose of decoupling the dynamics of the output signal POR which has a range equal to the power supply Vdd from that of the intermediate signal INTPOR which can have a smaller range. This allows increasing the response speed of the circuit and driving the POR line which has a high fan-out.

Although advantageous in some ways the power on reset circuit described above displays the serious shortcoming of excessive power consumption. Indeed, all the circuitry must necessarily remain on to be able to promptly regenerate the POR signal in case of a drop in supply voltage. This requires the presence of a rated current other than zero. Such rated behavior is undesirable for low consumption digital devices, such as, for example, those incorporated in cellular telephones.

Attention is drawn also to all the flash semiconductor memories powered, for example, with low voltage between 2.5 V and 3.6 V and for which is required a virtually null current (maximum 5 $\mu$A) on stand-by.

The technical problem underlying the present invention is to conceive a power on reset circuit having structural and functional characteristics, such as to allow virtually null current consumption in stand-by, while maintaining the characteristics of promptness in generating the power on reset signal in case of a drop in the power supply. This would allow overcoming the limitations and shortcomings of the present solutions proposed by the prior art.

SUMMARY OF THE INVENTION

The present invention equips the power on reset circuit with an extinguishing device which would, however, allow immediate return to the on state following a drop in supply voltage.

The present invention is directed to an electronic power on reset circuit comprising: a generator block for generating a first reference signal; a divider block for generating a second signal proportional to a supply voltage; and a comparator having at least two inputs for receiving on one input the first reference signal and on the other input the second signal proportional to the supply voltage and for producing an initialization signal as the output. The comparator also preferably has a third input of enablement turn off. In addition, the circuit further preferably includes at least one pair of series connected inverters connected between the output of the comparator and the third input of enablement turn off. The generator block and the divider block preferably comprise respective turn off enablement inputs also connected to the at least one pair of series connected inverters.

BRIEF DESCRIPTION OF THE DRAWINGS

The characteristics and advantages of the circuit in accordance with the present invention are set forth in the description of an embodiment thereof given below by way of non-limiting example with reference to the drawings.

DETAILED DESCRIPTION OF PREFERRED EMBODIMENTS

Figure 2:
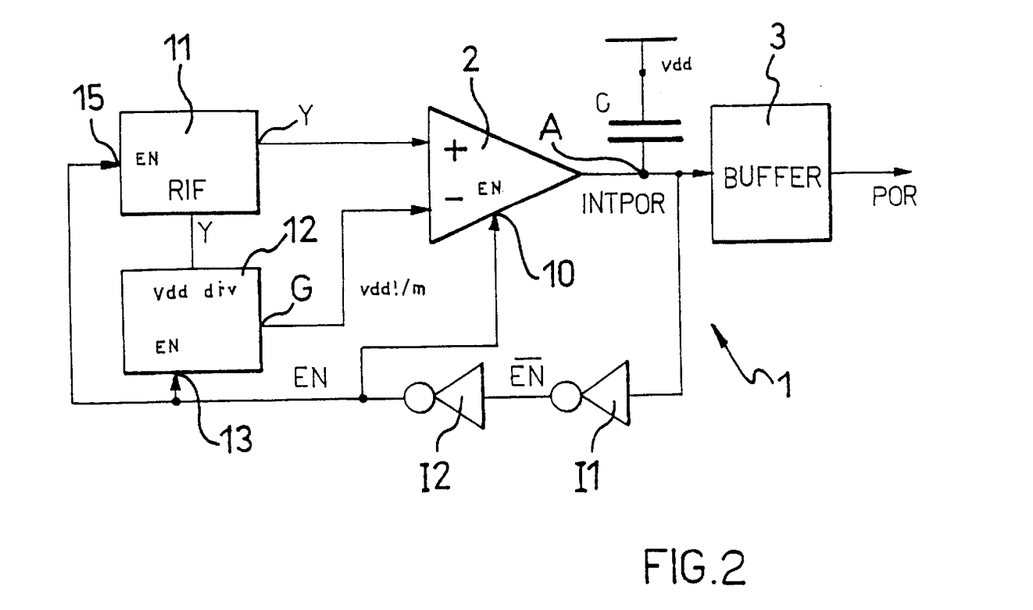
FIG. 2 shows a diagrammatic block view of a power on reset circuit provided in accordance with the present invention.

With reference to the above figures reference number 1 indicates as a whole and diagrammatically a power on reset circuit provided in accordance with the present invention. The circuit 1 is powered by a supply voltage Vdd and comprises a block 11 RIF generating a reference signal having one output y directly connected to a non-inverting input (+) of a comparator 2. The reference voltages is set preferably at 1.8 mV.

Figure 4:
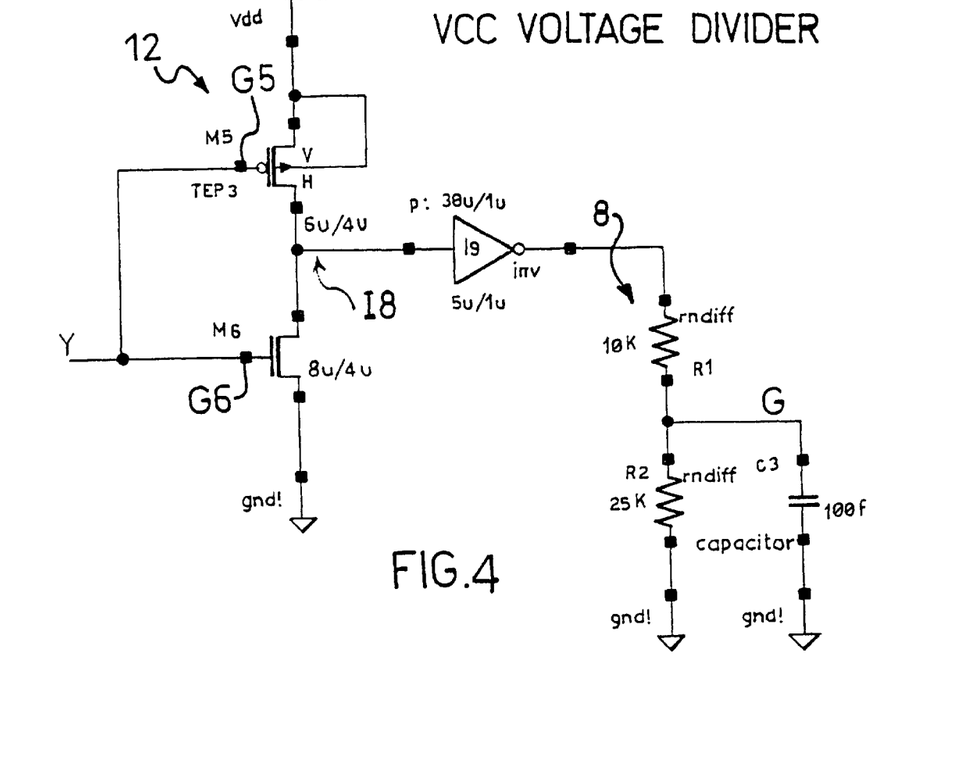

A divider block Vdd!div has one output G, visible in FIG. 4, connected to a second inverting input (−) of the comparator 2. The block Vdd!div is also indicated by the number 12 and has the duty of producing at output a voltage proportional to the supply voltage. Specifically the output of the divider block has the same linear behavior as the supply voltage Vdd but with a slope reduced by a predetermined factor m. The factor m is for all purposes a division ratio which must be ensured with accuracy and stability.

The output of the comparator 2 is a circuit node A which is coupled to the supply voltage Vdd through a capacitor C and is also connected to an output buffer 3 which produces the POR signal. The internal structure of the buffer 3 is conventional and a detailed description thereof is accordingly omitted. The capacitor C has the function of aiding the coupling of the signal INTPOR with the supply voltage Vdd during the rise transient of the latter. At rated operation the value of INTPOR remains fixed. The output buffer 3 has the purpose of disconnecting the dynamics of the output signal POR from that of the intermediate signal INTPOR. Advantageously in accordance with the present invention the circuit 1 comprises an inverter pair I1, I2 connected in mutual series between the output node A of the comparator 2, and a third input 10 for enablement of the comparator. The divider block 12 comprises in turn an enablement input 13 connected to the output of the second inverter I2. Even the generator block RIF comprises an enablement input 15 connected downstream of the two inverters I1, I2.

The diagram explained up to this point is quite general and solves the technical problem of the present invention. The various enablement inputs 10, 13 and 15 simultaneously receive the enablement signal EN and allow taking the circuit 1 to the off state once the POR signal has been generated. The circuit 1 is also capable of automatically leaving the off state following a drop in the supply voltage.

There is discussed below in detail the structure of the individual circuit blocks making up the circuit 1 and how they intervene in the various operating phases of the circuit. With special reference to the example of FIG. 3 there is described in detail the internal structure of the block 11 generating the reference potential. The block 11 comprises a biasing network 5 connected between the power supply Vdd and a reference potential, for example a ground signal GND.

Figure 3:
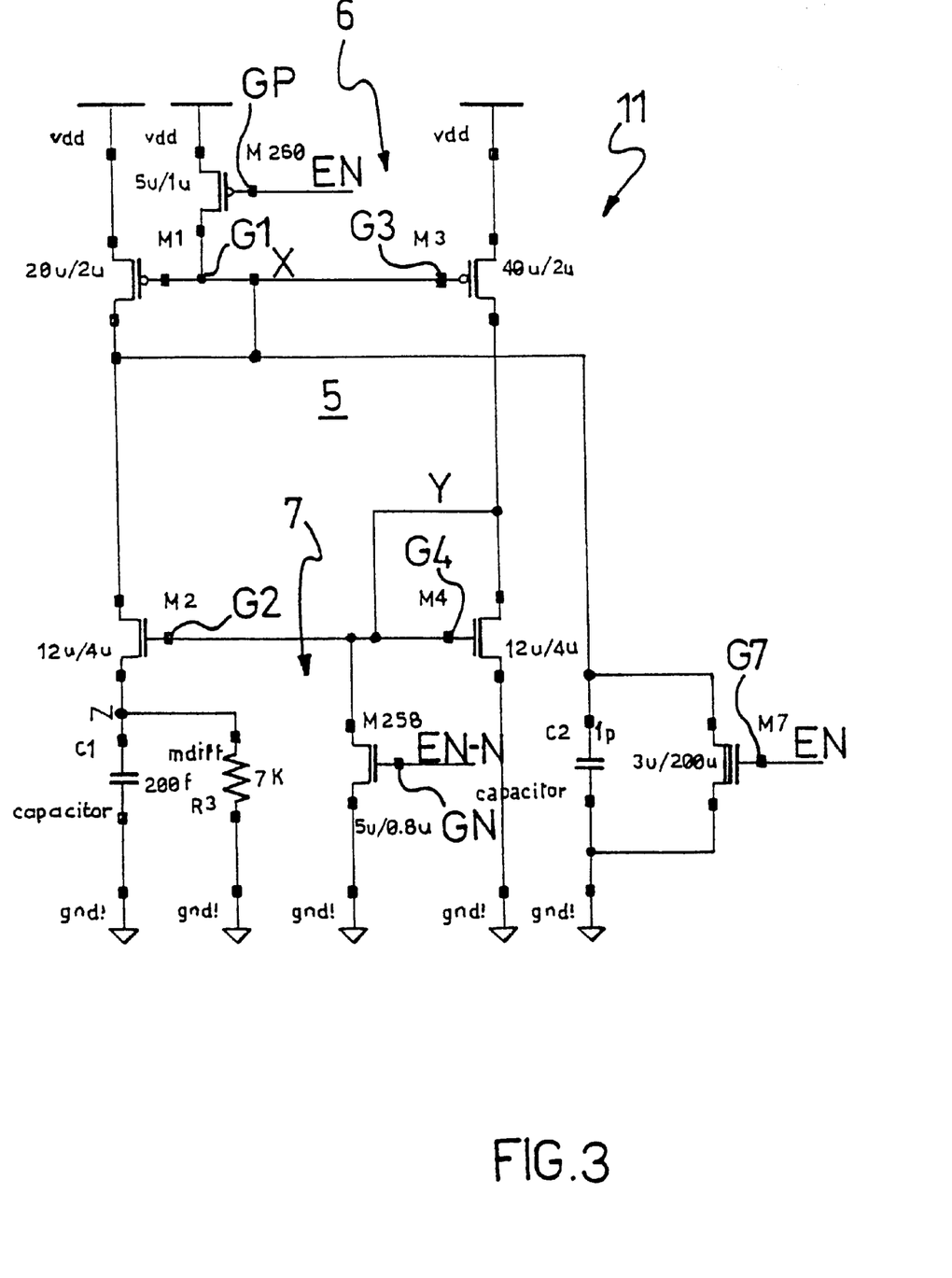
FIG. 3 shows a diagrammatic view of a detail of the voltage generator block power on reset circuit of FIG. 2, and FIGS. 4 to 6 show respective diagrammatic view of circuit details of the power on reset circuit provided in accordance with the present invention.

The network 5 comprises a first current mirror 6 including MOS P-channel transistors M1 and M3 with their respective gate terminals G1, G3 connected together in a common node X. The mirror 6 is controlled by a transistor M260 inserted between the power supply Vdd and the node X. The gate terminal GP of the transistor M260 corresponds to the input 15 to which is applied an enablement signal EN.

The network 5 comprises a second current mirror 7 including MOS N-channel transistors M2 and M4 with their respective gate terminals G2, G4 connected together in a common node Y. This common node Y also represents the output of the block RIF. The mirror 7 is controlled by a transistor M258 inserted between ground GND and the node Y. To the gate terminal GN of the transistor M258 is applied the negated enablement signal EN-N.

The transistor M2 was chosen with a threshold having a negative coefficient of variation with respect to the temperature. Between the source terminal of the transistor M2 and the ground GND is inserted the parallel combination of a capacitor C1 and of a resistance R3. The resistance R3 was provided to compensate the effects due to thermal drift and the value of which has a positive variation coefficient with respect to the temperature. The two current mirrors 6 and 7 are started by the transistors M260 and M258 when the signal EN reaches a high logical value.

As regards the divider block 12, with reference to FIG. 4 it can be appreciated that the basic structure comprises a resistive divider 8 comprising the resistances R1 and R2. The interconnection point G between the resistances R1, R2 is connected to ground GND by a capacitor C3.

A complementary pair of transistors M5 and M6 forms a first inverter I8 connected to one end of the divider 8 through a second inverter I9. The gate terminals G5, G6 of the transistors M5 and M6 are both connected to the node Y of the network 5. This allows starting the divider 8 only when the reference has reached its final value and thus performs a correct comparison. Under rated operating conditions the voltage signal present on the node Y has low logical value and the resistances R1 and R2 are short circuited to ground.

Figure 5:
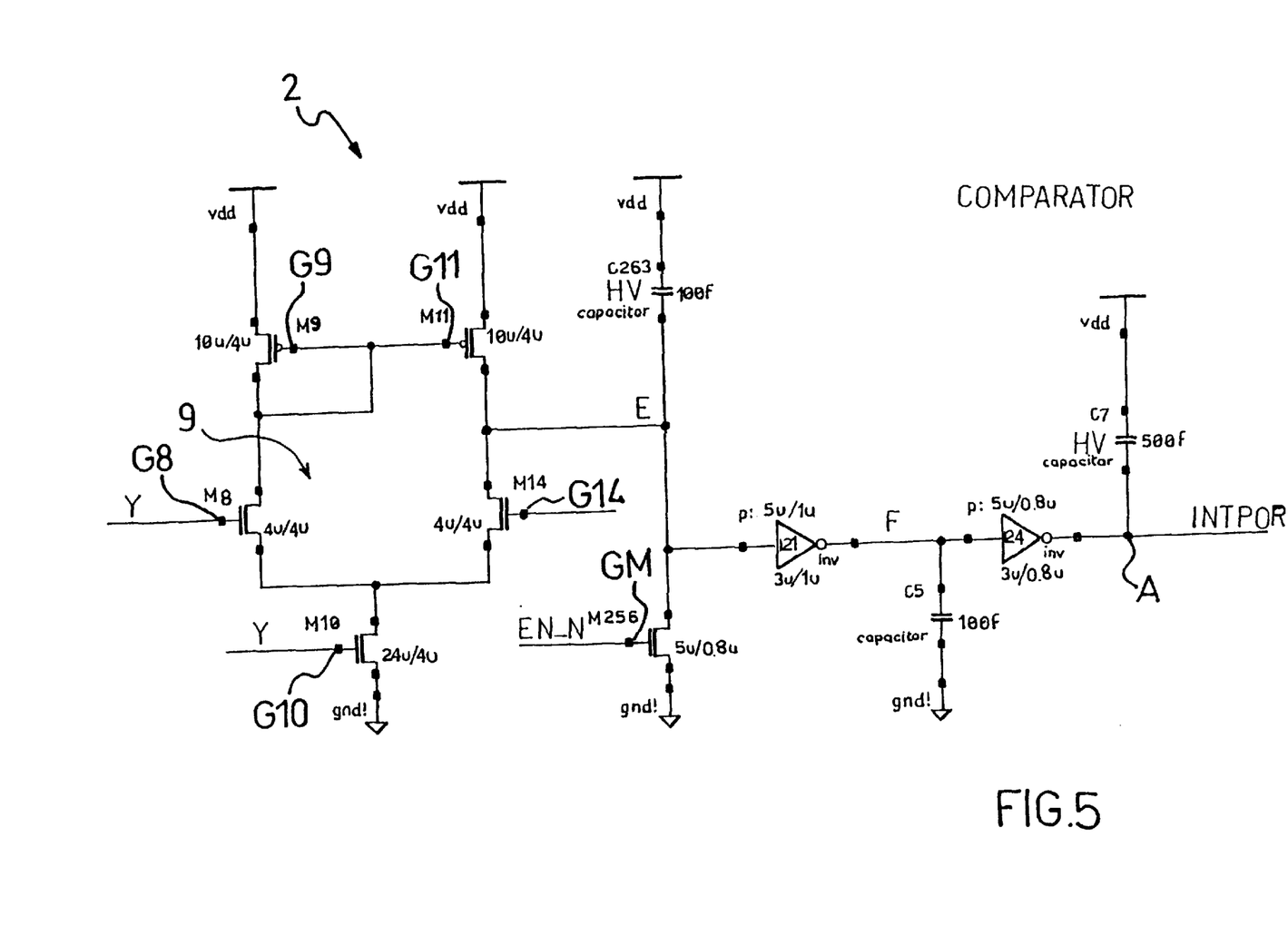

The internal structure of the comparator 2 is illustrated in detail in FIG. 5. This structure is in large part of known type with a differential cell 9 comprising the transistors M8 and M14 having their respective gate terminals operating as inputs of the comparator with one being connected to the output node Y of the network 5 and the other to the node G of the divider 8. The differential cell 9 is biased towards the power supply Vdd by a current mirror comprising the transistors M9 and M11, while it is connected to ground through a transistor M10 operating virtually as a current generator.

The differential cell 9 has an output node E connected to the power supply Vdd through a capacitor C263 capable of supporting high voltages. The node E is also connected to the output node A of the comparator through the series of two inverters I21 and I24. A node F for connection between these inverters is connected to ground through a capacitor C5.

The structure of the comparator 2 is distinguished essentially by the presence of a transistor M256 of the MOS N-channel type connecting the node E of the cell 9 to ground. On the gate terminal GM of this transistor M256 is applied the negated enablement signal EN-N. Advantageously, the signal output on the node E of the cell 9 is appropriately amplified by the two inverters I21 and I24 which, through the transistor M256, can be taken to a state of null consumption each time rated operating conditions are reached.

Figure 6:
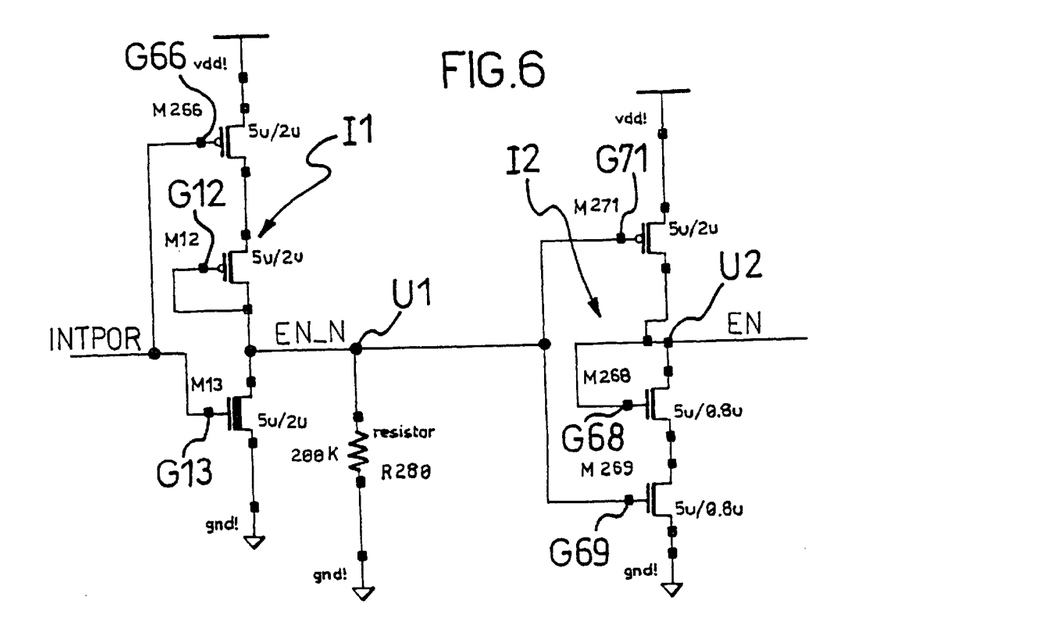

Lastly, in FIG. 6 is illustrated the structure of the inverter pair I1, I2 which connects the node A with the various enablement inputs of the blocks 2, 11 and 12. The first inverter I1 comprises a complementary pair of transistors M12 and M13 the first of which is in diode configuration. Between the power supply Vdd and the first M12 of these transistors is inserted another MOS P-channel transistor M266. The gate terminal G66 of the latter transistor and the gate terminal G13 of the transistor M13 are both connected to the node A and receive the intermediate signal INTPOR.

The output U1 of the first inverter I1 is connected to ground through a high value resistor R280 and produces the negated enablement signal EN-N. The output U1 is connected at input to the second inverter I2 which comprises a complementary pair of transistors M268 and M271. Another transistor M269, of the N-channel type, is connected between the transistor M268 and ground.

The gate terminals G69 and G71 of the transistors M269 and M271 are connected at output U1 while the transistor M268 is in diode configuration and has a drain terminal corresponding to the output U2 of the series of inverters I1, I2 and produces the enablement signal EN. It is important to note that the two inverters I1 and I2 do not have full dynamics between the power supply Vdd and ground GND with 0 V. The signals applied thereto are already brought in the direction of restarting to aid the power on reset when the supply voltage Vdd falls below a predetermined minimum value.

From the above description it is clear that the circuit 1 in accordance with the present invention solves the technical problem by allowing driving of the comparator 2, as well as the blocks 11 and 12 when they are off when the circuit has generated the power on reset circuit signal. In this manner there is null consumption of the circuit under rated operating conditions.

A rapid and automatic emergence from the off state is ensured after the supply voltage drop which causes immediate restarting of the initialization phase. Variations and modifications can be made to the circuit 1 of the present invention within the scope defined by the following claims.

We claim:

1. An electronic power on reset circuit comprising:
    a generator block for generating a first reference signal, said generator block comprising first and second current mirrors forming a biasing network connected between a supply voltage and a reference voltage reference each current mirror comprising and being driven by a respective turnoff transistor having a control terminal connected to a turn off enablement input;
    a divider block for generating a first reference signal proportional to a supply voltage said divider block having a turn off enablement input;
    a comparator having at least two inputs for receiving on one input the first reference signal coming from said generator block and on the other input the second signal proportional to the supply voltage emitted by said divider block and for producing at an output an initialization signal, said comparator having a third input of enablement turn off; and
    at least one pair of series connected inverters connected between the output of said comparator to respective turn off enablement inputs of said generator block and said divider block and to the third input of enablement turn off of said comparator.

2. A circuit in accordance with claim 1 wherein said divider block comprises a resistive divider and an inventor pair connected between an output of the generator block and one end of the resistive divider.

3. A circuit in accordance with claim 1 wherein said comparator comprises a differential cell having an output node coupled to the output of said comparator through a pair of inverters connected in series, and a turn off enablement transistor connected between said output node and a reference voltage and being driven by said at least one pair of series connected inverters.

4. A circuit in accordance with claim 1 wherein a first inverter of said at least one pair of series connected inverters comprises a complementary pair of first and second transistors, wherein the first transistor is connected in a diode configuration, and wherein a third transistor is connected between the power supply and the first transistor and has a gate terminal connected to a gate terminal of the second transistor and both connected to the output of said comparator.

5. A circuit in accordance with claim 4 further comprising a high-value resistor connecting an output of the first inverter to the ground and producing a negated enablement signal.

6. A circuit in accordance with claim 1 wherein the second inverter comprises a complementary pair of first and second transistors, the second of which is connected in a diode configuration, and a third transistor connected between a reference voltage and the second transistor and having a gate terminal connected to a gate terminal of the first transistor and both connected to an output of the first inverter.

7. An electronic power on reset circuit comprising:
    a generator block for generating a first reference signal,
    a divider block for generating a second signal proportional to a supply voltage, said divider block comprising a resistive divider and an inverter pair connected between an output of the generator block and one terminal of the resistive divider;
    a comparator having at least two inputs for receiving on one input the first reference signal coming from said generator block and on the other input the second signal proportional to the supply voltage emitted by said divider block and for producing at an output an initialization signal, said comparator having a third input of enablement turn off; and
    means for connecting the output of said comparator and the third input of enablement turn off.

8. A circuit in accordance with claim 7 wherein said means for connecting comprises at least one pair of series connected inverters.

9. A circuit in accordance with claim 8 wherein said generator block and said divider block comprise respective turn off enablement inputs connected to said at least one pair of series connected inverters.

10. A circuit in accordance with claim 8 wherein said generator block comprises first and second current mirrors forming a biasing network connected between the supply voltage and a reference voltage, with each mirror comprising and being driven by a respective turn off transistor having a control terminal connected to said at least one pair of series connected inverters.

11. A circuit in accordance with claim 8 wherein said comparator comprises a differential cell having an output node coupled to the output of said comparator through a pair of inverters connected in series, and a turn off enablement transistor connected between said output node and a reference voltage and being driven by said at least one pair of series connected inverters.

12. A circuit in accordance with claim 8 wherein a first inverter of said at least one pair of series connected inverters comprises a complementary pair of first and second transistors, wherein the first transistor is connected in a diode configuration, and wherein a third transistor is connected between the power supply and the first transistor and has a gate terminal connected to a gate terminal of the second transistor and both connected to the output of said comparator.

13. A circuit in accordance with claim 12 further comprising a high-value resistor connecting an output of the first inverter to ground and producing a negated enablement signal.

14. A circuit in accordance with claim 8 wherein the second inverter comprises a complementary pair of first and second transistors, the second of which is connected in a diode configuration and a third transistor connected between a reference voltage and the second transistor and has a gate terminal connected to a gate terminal of the first transistor and both connected to an output of the first inverter.

15. An electronic power on reset circuit comprising:
    a generator block for generating a first reference signal, said generator block comprising first and second current mirrors forming a biasing network connected between a supply voltage and a reference voltage, each current mirror comprising and being driven by a turn off transistor having a control terminal connected to a turn off enablement input;
    a divider block for generating a second signal proportional to a supply voltage, said divider having a turn off enablement input;

a comparator having at least two inputs for receiving on one input the first reference signal coming from said generator block and on the other input the second signal proportional to the supply voltage emitted by said divider block and for producing at an output an initialization signal, said comparator having a third input of enablement turn off; and connection means for connecting the output of said comparator to respective turn off enablement inputs of said generator block and said divider block, and to the third input of enablement turnoff of said comparator.

16. A circuit in accordance with claim 15 wherein said divider block comprises a restive divider and an inverter pair connected between an output of the generator block and one end of the restive divider.

17. A circuit in accordance with claim 15 wherein said comparator comprises a differential cell having an output node coupled to the output of said comparator through the connection means, and a turn off enablement transistor connected between said output node and a reference voltage and being driven by said connection means.

18. An electronic power on reset circuit comprising:

a generator block for generating a first reference signal;

a divider block for generating a second signal proportional to a supply voltage, said divider block comprising a resistive divider and an inverter pair connected. between an output of the generator block and one end of the resistive divider;

a comparator having at least two inputs for receiving on one input the first reference signal coming from said generator block and on the other input the second signal proportional to the supply voltage emitted by said divider block and for producing at an output an initialization signal, said comparator having a third input of enablement turn off; and at least one pair of series connected inverters connected between the output of said comparator and the third input of enablement turn off of said comparator.

19. A circuit in accordance with claim 18, wherein said generator block and said divider block have respective turn off enablement inputs connected to said at least one pair of series connected inverters.

20. A circuit in accordance with claim 19, wherein said generator block comprises first and second current mirrors forming a biasing network connected between the supply voltage and a reference voltage, each mirror comprising and being driven by a respective turn off transistor having a control terminal connected to said at least one pair of series connected inverters.

21. A circuit in accordance with claim 18, wherein said comparator comprises a differential cell having an output node coupled to the output of said comparator through a pair of inverters connected in series, and a turn off enablement. transistor connected between said output node and a reference voltage and being driven by said at least one pair of series connected inverters.

22. A circuit in accordance with claim 18, wherein a first inverter of said at least one pair of series connected inverters comprises a complementary pair of first and second transistors, wherein the first transistor is connected in a diode configuration, and wherein a third transistor is connected between the power supply and the first transistor and has a gate terminal connected to a gate terminal of the second transistor and both connected to the output of said comparator.

23. A circuit in accordance with claim 22, further comprising a high-value resistor connecting an output of the first inverter to ground and producing a negated enablement signal.

24. A circuit in accordance with claim 18, wherein the second inverter comprises a complementary pair of first and second transistors, the second of which is connected in a diode configuration, and a third transistor connected between a reference voltage and the second transistor and having a gate terminal connected to a gate terminal of the first transistor and both connected to an output of the first inverter.

* * * * *

UNITED STATES PATENT AND TRADEMARK OFFICE
CERTIFICATE OF CORRECTION

PATENT NO. : 5,929,674   Page 1 of 2
DATED : July 27, 1999
INVENTOR(S) : Marco MACCARRONE, Stefano GHEZZI, Maurizio BRANCHETTI It is certified that error appears in the above-identified patent and that said Letters Patent is hereby corrected as shown below:

On the title page, item

| | | |
|---|---|---|
| [30] Foreign Application Priority Data | Strike: | "9630247" |
| | Insert: | --96830247-- |
| Column 4 line 64 | Strike: | "0 V." |
| | Insert: | --0V.-- |
| Column 5 line 18 | Strike: | "voltage" |
| | Insert: | --voltage,-- |
| Column 5 line 19 | Strike: | "reference" |
| Column 5 line 20 | Strike: | "turnoff" |
| | Insert: | --turn off-- |
| Column 5 line 22 | Strike: | "first reference" |
| | Insert: | --second-- |
| Column 6 line 62 | Between "a" and "turn" insert --respective-- | |
| Column 6 line 66 | Strike: | "a" |
| | Insert: | --the-- |
| Column 6 line 66 | Between "divider" and "having" insert --block-- | |

UNITED STATES PATENT AND TRADEMARK OFFICE
CERTIFICATE OF CORRECTION

PATENT NO. : 5,929,674
DATED : July 27, 1999
INVENTOR(S) : Marco MACCARRONE et al It is certified that error appears in the above-identified patent and that said Letters Patent is hereby corrected as shown below:

Column 7 line 15    Strike: "restive"
                    Insert: --resistive--

Column 7 line 26    Strike: "connected."
                    Insert: --connected--

Signed and Sealed this

Ninth Day of May, 2000

Attest:

Q. TODD DICKINSON

Attesting Officer        Director of Patents and Trademarks

UNITED STATES PATENT AND TRADEMARK OFFICE
CERTIFICATE OF CORRECTION

PATENT NO.   : 5,929,674
DATED        : July 27, 1999
INVENTOR(S)  : Marco Maccarrone, Stefano Ghezzi, Maurizio Branchetti It is certified that error appears in the above-identified patent and that said Letters Patent is hereby corrected as shown below:

Title page,
Item [30] Foreign Application Priority Data, strike, "9630247" and insert
-- 96830247 --

Column 2,
Line 63, delete "1.8 mV" insert -- 1.8 V --

Column 4,
Line 64, strike "O V." insert -- OV. --

Column 5,
Line 18, strike "voltage" insert -- voltage, --
Line 19, strike "reference"
Line 20, strike "turnoff" insert -- turn off --
Line 22, strike "first reference" insert -- second --

Column 6,
Line 62, between "a" and "turn" insert -- respective --
Line 66, strike "a" insert -- the -- and between "divider" and "having" insert -- block --

Column 7,
Line 15, strike "restive" insert -- resistive --
Line 26, strike "connected." insert -- connected --

Signed and Sealed this

Twenty-fifth Day of December, 2001

Attest:

*Attesting Officer*

JAMES E. ROGAN
*Director of the United States Patent and Trademark Office*